United States Patent [19]

Fink

[11] Patent Number: 5,250,817
[45] Date of Patent: Oct. 5, 1993

[54] ALKALI BARRIER SUPERCONDUCTOR JOSEPHSON JUNCTION AND CIRCUIT

[75] Inventor: Richard L. Fink, Austin, Tex.

[73] Assignee: Microelectronics and Computer Technology Corporation, Austin, Tex.

[21] Appl. No.: 928,984

[22] Filed: Aug. 12, 1992

[51] Int. Cl.$^5$ .............. H01L 39/22; B05D 5/12; H01B 12/00

[52] U.S. Cl. .................. 257/35; 257/36; 257/39; 505/1; 505/702; 427/62

[58] Field of Search ........... 357/5; 505/1, 702, 784; 427/62, 63; 257/33, 35

[56] References Cited

U.S. PATENT DOCUMENTS

| | | | |
|---|---|---|---|
| 4,933,317 | 6/1990 | Johnson, Jr. et al. | 505/784 |
| 5,034,374 | 7/1991 | Awaji et al. | 351/5 |
| 5,077,271 | 12/1991 | Hiskes et al. | 505/1 |
| 5,145,830 | 9/1992 | Kohiki et al. | 505/1 |

OTHER PUBLICATIONS

Wu et al. "Transport Measurement of 32K Superconductivity in the Ba-K-Bi-O System", Appl. Phys. Lett., vol. 53, #12, Sep. 19 1988, pp. 1116-1118.

E. Hellman, et al., "Molecular Beam Epitaxy of Superconducting Bismuthates on Various Substrates" *Mat. Res. Soc. Symp. Proc.* vol. 221 (1991).

J. McCamy, et al. "In Situ Growth of Epitaxial Superconducting YBa$_2$Cu$_3$O$_{7-x}$ Films on Insulating, Semiconducting and Ferroelectric K(Ts,Nb)O$_3$ by Pulsed Laser Ablation" *Mat. Res. Soc. Symp. Proc.* vol. 169. (1990).

S. Hashiguchi, et al. "YBaCuO Thin-Film Growth on Electrooptic LiNbO$_3$ Substrate with Buffer Layer" *Jpn. J. Appl. Phys.* vol. 31 (Mar. 1992) pp. 780-785.

E. Gololobov, et al. "Influence of Lithium Niobate Additions on the Properties of Bismuth and Yttrium High-T$_c$ Superconductors" phys. stat. sol. (a)129, K39(1992).

K. Imada et al. "YBCO Superconducting Films on LiNbO$_3$ with Buffer Layers for Optical Modulators" *Supercond. Sci. Techno.* 4(1991) 473-475.

A. Yoshida, et al. "Electrical Properties of Au/ and YBa$_2$Cu$_3$O$_{7-x}$/SrTi$_{1-y}$NB$_y$O$_3$ Diodes" *J. Appl. Phys.*, vol. 70, No. 9, (1991).

R. Sobolewski, "Application of High-T$_c$ Superconductors in Optoelectronics" *Plenary lecture at the International Congress on Optical Science and Engineering,* The Hague, The Netherlands (Mar. 11-15, 1991), and SPIE Proceedings to be published.

M. Eschwei, et al. "On the Fabrication, Characterization and Enhancement of YBCO Films on LiNbO$_3$, Substrates Deposited by a Sputter S-Gun" 1991 *American Institute of Physics* (1991).

M. Geselbracht, et al. "Superconductivity in the Layered Compound Li$_x$NbO$_2$" Nature vol. 345, (May 24, 1990).

(List continued on next page.)

*Primary Examiner*—Rolf Hille
*Assistant Examiner*—Mahshid Saadat
*Attorney, Agent, or Firm*—Kevin L. Daffer

[57] ABSTRACT

A superconducting Josephson junction, circuit and method of manufacture is provided for maintaining optimal chemical and structural compositions at the interface region between an insulating barrier (12) and a pair of superconductor electrodes (14) and (16). Each superconductor electrode of the Josephson junction comprises a chemical selected from the group consisting of Ba$_{1-x}$K$_x$BiO$_3$ and Ba$_{1-x}$Rb$_x$BiO$_3$. In addition, the insulating barrier (12), formed between the electrode pair (14) and (16), is made of a chemical compound including an alkali element. The alkali element within the barrier region serves to eliminate or reduce ion migration from the BKBO or BRBO superconducting electrodes. The alkali element in the barrier (12) as well as the superconductor electrodes (14) and (16) also provides good structural matching at the barrier-electrode interface regions. As a result of the chemical and structural matching between the superconductor electrodes and the barrier, an SIS Josephson tunnel junction and integrated circuit is formed having high quality histeretic properties.

25 Claims, 7 Drawing Sheets

OTHER PUBLICATIONS

R. Feenstra, et al. "Microstructure and Critical Currents of $YBa_2Cu_3O_{7-x}$ Thin Films on $SrTiO_3$" *Science and Technology of Thin Film Superconductors*, (1989).

K. Blazey, et al. "Modulated Microwave Absorption of $YBa_2Cu_3O_{7-\delta}$ Thin Films on $LiNbO_3$" *Solid State Communications*, vol. 72, No. 12, pp. 1199-1201, (1989).

S. Lee, et al. "Epitaxial Growth of $YBa_2Cu_3O_{7-\delta}$ Thin Films on $LiNbO_3$ Substrates," (Jul. 1989).

H. Schmidt, et al. "Low Temperature Preparation of Superconducting $YBa_2Cu_3O_x$ Thin Films on $LiNbO_3$, Silicon and $SrTiO_3$ By r.f.-Magnetron Sputtering" *Journal of the Less-Common Metals*, 151 (1989) 287-283.

R. Feenstra, et al. "Epitaxial Superconducting Thin Films of $YBa_2Cu_3O_{7-x}$ on $KTaO_3$ Single Crystals" *Appl. Phys. Lett.* 54 (11) (Mar. 13, 1989).

A. Höhler, et al. "Fully Textured Growth of $Y_1Ba_2Cu_3O_{7-\delta}$ Films by Sputtering on $LiNbO_3$ Substrates" *Appl. Phys. Lett.* (11), (Mar. 13, 1989).

G. Rao, et al. "Search for Superconductivity in Mixed Niobium Oxides" *Physica* C 153-155 (1988) 501.

J. Thompson, et al. "Very Low-Temperature Search for Superconductivity in Semiconducting $KTaO_3$," *Jr. of Low Temp. Phys.*, vol. 47, Nos. 5/6 (1982).

E. Chase, et al. "Laser Deposited High Tc Superconducting Thin Films," *Proc. of the 2nd Annual Conference on Superconductivity and Applications*, (Apr. 1988).

T. Venkatesan et al. "Substrate effects on the properties of Y-Ba-Cu-O Superconducting films Prepared by Laser Deposition," *Jr. of App. Phys.* (May 1988).

A. Lee, et al, "$LaAlO_3$-YBCO Multilayers," *IEEE Trans. on Magnetics*, vol. 27, No. 2 (Mar. 1991).

E. Hellman, et al., "$Ba_{1-x}K_xBiO_3$ Sandwich-Type Tunnel Junctions Grown by Molecular Beam Epitaxy," submitted to *Appl. Phys. Lett.*, (Mar. 13, 1982).

J. Barner et al, "All a-axis oriented $YBa_2Cu_3O_{7-y}$-$PrBa_2Cu_3O_{7-x}$-$YBa_2Cu_3O_{7-y}$ Josephson devices operating at 89K, " *Appl. Phys. Lett.* (Aug. 1991).

E. Hellman, et al., "$Ba_{1-x}K_xBiO_3/BaBi_2O_y$ Thin Film Heterostructures", Physica C (Dec. 1991).

K. Hirata et al., "Tunneling Meassurements on Superconductor/Insulator/Superconductor Junctions Using Single-Crystal $YBa_2Cu_3O_{7-x}$ Thin Films" *Appl. Phys. Lett.* (Feb. 1990).

J. Kingston, et al., "Multilayer $YBa_2Cu_3O_x$-$SrTiO_3$-$YBa_2Cu_3O_x$ Films for Insulating Crossovers," *Appl. Phys. Lett.* (Jan. 1990).

Q. Ying, et al., "$YBa_2Cu_3O_{7-y}$-$Y_2O_3$ System and in Situ Deposition of Trilayer Heterostructures by Coevaporation," *Appl. Phys. Lett.* (Dec. 1991).

I. Iguchi, et al. "Tunneling Characteristics of YBaCuO/MgO/Pb Planar Tunnel Junctions and Observation of Josephson Effect," *Jap. Jr. of Appl. Phys.*, vol. 29, No. 4 (Apr. 1990).

S. Pei, et al., "Structural Phase Diagram of the $Ba_{1-x}K_xBiO_3$ System," *Physical Review B*, vol. 42, No. 7 (Mar. 1990).

A. Heinrich, et al., "The System $Ba_{0.6}K_{0.4-x}Cs_xBiO_3$; Superconductivity Dependence of Tc on the Cesium Content," *Solid State Communications*, vol. 80, No. 7 (1991).

T. Graettinger, et al., "Electro-optic Characterization of Ion Beam Sputter-Deposited $KNbO_3$ Thin Films," *Appl. Phys. Lett.*, (Feb. 1991).

G. Virshup, et al., "Hysteretic, Hich $T_c$ Josephson Junctions Using heterostructure Trialyer Films Grown by Molecular Beam Epitaxy," *Appl. Phys. Lett.* vol. 60, No 18 (May 1992).

S. Michikami, et al., "Epitaxial Growth of $Sr_xTiO_3$ and Fabrication of $EuBa_2Cu_3O_{7-\delta}/Sr_xTiO_y$Pb Tunnell Junctions," *J. Japanese Journal of Applied Physics*, vol. 30, No. 3 (Mar. 1991).

ALKALI BARRIER SUPERCONDUCTOR JOSEPHSON JUNCTION AND CIRCUIT

The U.S. Government has a paid-up license in this invention and limited circumstances to require the patent owner to license others on reasonable terms as provided for by the terms of contract No. N00014-90-C-0088 awarded by the Defense Advanced Research Projects Agency (DARPA).

BACKGROUND OF THE INVENTION

1. Field of the Invention

This invention relates to a superconducting Josephson junction, circuit and method of manufacture and, more particularly, to an insulating barrier material having a chemical and structural composition generally compatible with that of the superconducting material.

2. Description of the Relevant Art

A superconductor-insulator-superconductor (SIS) Josephson junction is an electronic device consisting of two superconducting electrodes separated by a very thin insulating barrier. The thin insulating barrier permits the passage of supercurrents which tunnel through the barrier while maintaining zero voltage across the junction. Josephson devices switch very rapidly from zero voltage to a finite voltage level when current levels exceed a critical threshold value $I_c$ of supercurrents. The switching voltage is dependent on the superconductor material used, and is typically a few mV, as compared to the switching voltages of silicon and gallium arsenide transistors which are generally greater than 200 mV to 500 mV.

Because of their low operating voltages, Josephson devices can operate as low power, fast digital switches. Once current exceeds the threshold value $I_c$ (usually less than 1 mA), the device will switch rapidly from, e.g., an "off" state to an "on" state. Since the threshold current is quite low and the device exhibits low switching voltage, very little power is dissipated during operation. These properties, along with the ability to detect small amounts of magnetic fields or field gradients, make Josephson devices potentially useful in high performance computers, sensors and communication systems.

Many superconductors operate according to the principles of superconductivity analyzed by the well known Bardeen, Cooper and Schrieffer theory ("BCS theory") which predicted how the forces between electrons and surrounding atoms in the superconducting matrix material can lead to a pairing of electrons, called "Cooper pairs" resulting in zero resistance. An important part of the BCS theory is the calculation of the coherence length. Coherence length is a measure of the size of the Cooper pair and is defined as the fundamental size scale of superconductivity. The degree of superconductivity does not change over an arbitrarily short distance in the superconductor, but can change only over the characteristic distance of the coherence length.

To maintain tunneling of supercurrents through a Josephson junction, it is important that the properties of the superconductor be maintained to within a coherence length of the barrier. If regions of non-superconductivity in the superconducting electrode at the barrier interface exceed the coherence length, then the supercurrents are significantly decayed and may cease. Likewise the finite voltage characteristics of the tunnel junction are also dependent on the quality of the superconducting electrode at the barrier interface. The non-zero voltage behavior of the tunnel junction is a characteristic of the electronic states of the electrode material at the barrier interface. For superconductors, a gap in the electronic states exists creating a gap in the current-voltage (I-V) behavior of the junction with no current flow in the sub-gap region between $-V_g$ and $+V_g$, as shown in FIG. 1. If, however, the electrode material at the barrier interface is not superconducting to within the coherence length, then non-superconducting characteristics are sampled in the I-V behavior of the device and this gap structure will be degraded or be eliminated completely, and sub-gap current may exist.

One important property of a high quality SIS Josephson device is its hysteretic behavior. Hysteretic behavior is largely dictated by the previous state of the device, whether it was in a zero voltage or a finite voltage state. As stated previously, FIG. 1 is an exemplary hysteretic current-voltage behavior of an ideal SIS Josephson tunnel junction at absolute zero temperature. As shown, if the junction is in the zero voltage state, it will remain there if the current does not exceed $I_c$. As current is increased above $I_c$, the supercurrent is quenched and the device experiences normal electron (not Cooper pair) flow through the barrier, which requires a voltage. Once normal flow is achieved, the corresponding voltage will remain, regardless of whether the current is above or below $I_c$, until the current is brought all the way back to near zero. Thus, as current is increased from zero, the voltage across the Josephson device will appear only after current exceeds $I_c$. However, once in the finite voltage state, voltage will remain even after the current drops to a much smaller current well below $I_c$. An important property of hysteresis is the ability to latch or store a voltage even after the current drops below threshold. The modulating current must thereby drop to near zero before the logic state is lost. Several applications of superconducting tunnel junctions further require that the current flowing at voltages less than $V_g$ ("energy gap") be small. According to the BCS theory, a sub-gap current flowing at $V<V_g$ would be zero for an ideal tunnel junction operated at absolute zero temperature. In some switching applications, the low sub-gap current is required to ensure that the device will switch to a relatively high voltage (near $V_g$) when switched out of the zero voltage state. When tunnel junctions are used for detecting or mixing millimeter waves, small sub-gap currents are required for high sensitivity.

Some compound superconductor materials display superconductive properties that are sensitive to small changes in the stoichiometry and the crystalline structure of the material. During manufacture of the Josephson junction, the superconductor electrode material may become depleted by diffusion of its components into the barrier. Depletion or out-diffusion of the superconductor components may cause a relative change in the material's stoichiometry for a distance exceeding the coherence length measured from the barrier which can thereby adversely affect the material's superconductive properties. Therefore, it becomes necessary to maintain the chemical compositions of such superconductors in order to preserve its superconductive properties to within a coherence length of the barrier. Likewise, the crystalline structure of some of these compound superconductors must also be maintained to within a coherence length of the barrier.

While there are many types of superconductive materials, there has been little success in making quality SIS Josephson tunnel junctions from some of the more desirable materials. Recent emphasis has been placed on finding materials with high critical temperature $T_c$ so that less expensive and more convenient means can be used to cool the superconductor. Examples of high $T_c$ materials are yttrium barium copper oxide ($YBa_2Cu_3O_{7-x}$), sometimes referred to as YBCO and having a $T_c$ equal to approximately 92K, and bismuth strontium calcium copper oxide ($Bi_2Sr_2CaCu_2O_8$), sometimes referred to as BSCCO and having a $T_c$ equal to approximately 105K. While the above material exhibit high $T_c$, they do not produce a high quality SIS tunnel junction characteristics when incorporated into a Josephson device. Furthermore, the compound oxide superconductors described above must be in crystalline form for optimal performance. For the standard configurations of SIS tunnel junctions, it is desirable that the crystalline properties be preserved right up to the superconductor-barrier interface for both interfaces. This generally requires that the barrier be crystalline and have a good structural match with the lattice of the superconductor in the plane of the interface. Using a trilayer example, a barrier which is grown on the top surface of the bottom superconductor must have a base geometric size and shape which closely matches the bottom superconductor and, likewise, the top geometric size and shape of the barrier must closely match the top superconductor. If the barrier lattice does not match the superconductor lattice, then the resulting lattice strain and growth defects quench the superconducting properties in the interface region.

Recent studies by A. Lee, et al., "LaAlO$_3$-YBCO Multilayers, "*IEEE Trans. on Mag.*, vol. 27, no. 2, March 1991; Q. Ying, et al., "YBa$_2$Cu$_3$O$_{7-x}$-Y$_2$O$_3$ System and in situ Deposition of Trilayer Heterostructures by Coevaporation,"*Appl. Phys. Lett.*, 59 (23), December 1991; J. Barner, et al., "All a-axis Oriented YBa$_2$Cu$_3$O$_{7-y}$-PrBa$_2$Cu$_3$O$_{7-z}$-YBa$_2$Cu$_3$O$_{7-y}$ Josephson Device Operating at 80K," *Appl. Phys. Lett.*, 59 (6), August 1991; and, I. Iguchi, et al., "Tunneling Characteristics of YBaCuO/MgO/Pb Planar Tunnel Junctions and Observation of Josephson Effect," *Japanese Jr. of Appl. Phys.*, vol. 29, no. 4, April 1990 demonstrate that YBCO used with LaAlO$_3$, Y$_2$O$_3$, PrBa$_2$Cu$_3$O$_7$ and MgO barriers, respectively, may produce a less than optimal Josephson device. As demonstrated, YBCO material, combined with an insulative barrier material may not produce a good SIS junction with desired hysteretic effect. It is commonly known that the coherence length of YBCO material is approximately in the range of two to five angstroms in a direction perpendicular to the Cu planes and 10 to 30 angstroms within the Cu planes. The relatively short coherence length for YBCO material is equally true for BSCCO materials. The lattice disruption of the superconductor-barrier interface which produces a region of non-superconducting YBCO (or BSCCO) that is larger than its coherence length (as measured from the barrier interface) may certainly be one explanation for the poor device performance of these materials. A material with a longer coherence length is therefore desirable in overcoming this obstacle.

The cubic perovskites $Ba_{1-x}K_xBiO_3$ (or BKBO) and $Ba_{1-x}Rb_xBiO_3$ (or BRBO) are superconductors with measured coherence lengths of approximately 50 angstroms. Coherence lengths of BKBO and BRBO are not only longer than those of YBCO or BSCCO but are also directionally isotropic. Longer coherence lengths gives BKBO and BRBO materials an advantages when used as electrodes in an SIS tunnel junction. The superconducting transition temperature $T_c$ of BKBO and BRBO is above 30K, lower than that of YBCO or BSCCO but twice as high as the $T_c$ (16K) of niobium nitride NbN, the highest $T_c$ currently known to produce high quality SIS Josephson tunnel junctions. With a transition temperature of 30K, a suitable operating range of the junction would be 12K-18K, which can be achieved with a closed-cycle refrigerator. Liquid helium would not be needed to chill the device, which is a significant advantage. Furthermore, there are many applications which require an operating temperature of 12K. It would not be an advantage in these cases to use superconducting materials with $T_c$'s above 90K. In fact, it would be a disadvantage since, for higher $T_c$ materials, the switching voltages will be larger and therefore the power dissipated by high $T_c$ devices will also be larger.

An attempt to make all-BKBO SIS junctions was reported in a preprint by E. Hellman, et al., "Ba$_{1-x}$K$_x$BiO$_3$ Sandwich-Type Tunnel Junctions Grown by Molecular Beam Epitaxy," submitted to *Appl. Phys. Lett.*, Mar. 13, 1992. The barrier used for the Hellman et al. device was BaBi$_2$O$_y$ of undefined structure. Although BaBi$_2$O$_y$ may be a good lattice match to BKBO, BaBi$_2$O$_y$ may not be chemically compatible with BKBO. It is well known that alkali ions in solid solution are highly mobile and readily diffuse, especially at the elevated temperatures used to fabricate Josephson junctions and/or circuits. Typically, BKBO and BRBO are made in oxygen deficient atmospheres that lead to oxygen vacancies in materials during fabrication which further promotes ion diffusion. The diffusion from the concentrated BKBO region to the BaBi$_2$O$_y$ (which is initially void of K) may deplete the K ion concentration in the BKBO at the interface, thereby reducing or quenching its superconductive properties in this region.

The diffusion of mobile potassium ions from the BKBO top and bottom electrode and into the barrier which does not initially contain a potassium (K) compound is shown in FIG. 5. While an optimal alkali (or K) concentration, x, should remain near 0.4 throughout the BKBO structure, FIG. 5 illustrates possible non-superconducting regions, n, forming within the BKBO material near the barrier interface. As the concentration level decreases to a level less than that necessary to sustain superconductivity and for a distance n greater than the coherence length, regions of non-superconductivity arise which will destroy or pinch off the superconducting tunnel current. In addition, diffusion of impurity ions into the barrier may decrease its optimal insulating characteristics as well. A decrease in insulating characteristics may result in an SNS combination rather than a high quality SIS combination.

The problems associated with YBCO materials using conventional barrier combinations do not provide for high quality SIS Josephson devices having ideal or near ideal tunnel junction behavior. The relatively short coherence lengths of YBCO and BSCCO places very high demands on the quality of the barrier interfaces. Still further, the problems with potassium ion migration from the BKBO electrode to the barrier will adversely decrease the optimal concentrations of alkali ions within the BKBO superconductor or adversely inject alkali ions into non-alkali barriers.

SUMMARY OF THE INVENTION

The problems outlined above are in large part solved by the alkali barrier superconductor Josephson junction, circuit and method of manufacture of the present invention. That is, the Josephson junction of the present invention is an SIS structure which utilizes an insulating barrier containing an alkali compound, and the presence of the alkali element within the compound eliminates or reduces the net migration of alkali ions from the BKBO or BRBO superconducting electrode. Specifically, the alkali compound within the barrier helps ensure BKBO and BRBO superconductor electrodes remain superconducting up near the barrier interface by maintaining the necessary concentrations therein. In addition, alkali diffusion will not degrade optimal insulative concentrations in the barrier necessary for high quality, hysteretic SIS tunnel junctions. Still further, the alkali compounds specified within the barrier material help ensure some structural similarity and lattice matching at the interface region between the superconductor electrode and the barrier. By providing alkali composition in the barrier which generally match the chemical and structural composition of the alkali composition in the superconductor electrode, the present invention is thereby capable of maintaining optimal superconducting and insulating properties.

Broadly speaking, the present invention contemplates a superconductor Josephson junction comprising a first and a second superconducting material, each material comprises a chemical compound selected from the group consisting of $Ba_{1-x}K_xBiO_3$ (or BKBO) and $Ba_{1-x}Rb_xBiO_3$ (or BRBO). An insulating barrier is formed between the first and second superconducting material wherein the barrier material comprises an alkali compound. The alkali compound comprises an element from the group consisting of Li, Na, K and Rb. An optimal x concentration of K or Rb is approximately 0.4. By using alkali compounds in both the superconductor electrode and the barrier, net diffusions across the interface region are reduced. Furthermore, if alkali concentration in the barrier region is greater than alkali concentration in the superconducting electrode, then normal processing steps will not decrease the electrode concentrations below an initial value.

The present invention is also directed to a superconductor Josephson integrated circuit. The integrated circuit comprises a single crystalline substrate and a thin film of first superconducting material epitaxially grown upon the substrate. The first superconducting material comprises a chemical selected from the group consisting of $Ba_{1-x}K_xBiO_3$ (or BKBO) and $Ba_{1-x}Rb_xBiO_3$ (or BRBO). A thin film of insulating barrier is epitaxially grown upon the first superconducting material wherein the barrier comprises a chemical selected from the group consisting of the niobates of Li, Na, K and Rb. Alternatively, or in addition to the chemical selected from the group consisting of the niobates of Li, Na, K and Rb, the barrier comprises a chemical selected from the group consisting of the tantalates of Li, Na, K and Rb. A second superconducting material is epitaxially grown as a thin film upon the insulating barrier wherein the second superconducting material comprises a chemical compound selected from the group consisting of $Ba_{1-x}K_xBiO_3$ and $Ba_{1-x}Rb_xBiO_3$. An electrical lead is coupled to each of the first and second superconducting materials to form an electric circuit therebetween. A modulating current can be placed between the leads registering substantially zero voltage up until the current exceeds a critical threshold value $I_c$. The Josephson integrated circuit can be lithographically formed with other superconducting or non-superconducting circuits in a single monolithic design.

The present invention is still further directed to a method of fabricating a superconducting Josephson integrated circuit. The method comprises the steps of placing a cleaned and polished substrate within a chamber under partial vacuum and then heating the substrate to a specified temperature. A buffer layer may then be deposited upon the substrate wherein the buffer layer comprises an alkali compound. Alternatively, the buffer layer may comprise other chemicals that are structurally and chemically compatible with both the substrate and a first superconducting material subsequently placed on the buffer. The first superconducting material is deposited upon the substrate or buffer wherein the first superconducting material comprises a chemical selected from the group consisting of $Ba_{1-x}K_xBiO_3$ (or BKBO) and $Ba_{1-x}Rb_xBiO_3$ (or BRBO). A thin film of insulating barrier material is then deposited upon the first superconducting material and subsequently a second superconducting material is deposited upon the barrier. The second superconducting material is chemically similar to the first superconducting material, whereas the insulating barrier material may be chemically similar to the substrate buffer material. Once the trilayer structure of first superconducting material, insulating barrier and second superconducting material is formed, oxygen is added to the chamber and the substrate is subsequently cooled. Thereafter, electrical leads can be deposited on the first and second superconducting material to form a Josephson integrated circuit therebetween.

BRIEF DESCRIPTION OF THE DRAWINGS

Other objects and advantages of the invention will become apparent upon reading the following detailed description and upon reference to accompanying drawings in which.

Figure 1:
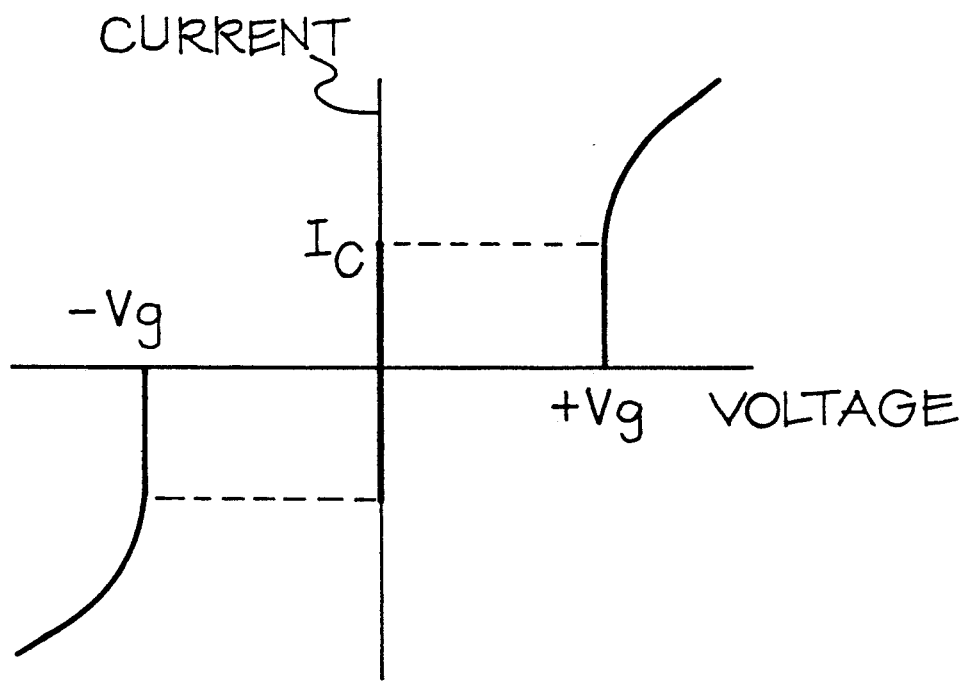
FIG. 1 is a current versus voltage graph of an ideal SIS Josephson tunnel junction at absolute zero temperature according to an ideal prior design.

While the invention is susceptible to various modifications and alternative forms, a specific embodiment thereof has been shown by way of example in the drawings and will herein be described in detail. It should be understood, however, that the drawings and description thereto are not intended to limit the invention to the particular form disclosed, but on the contrary, the intention is to cover all modifications, equivalents and alternatives falling within the spirit and scope of the invention as defined by the appended claims.

DETAILED DESCRIPTION OF THE INVENTION

Figure 2:
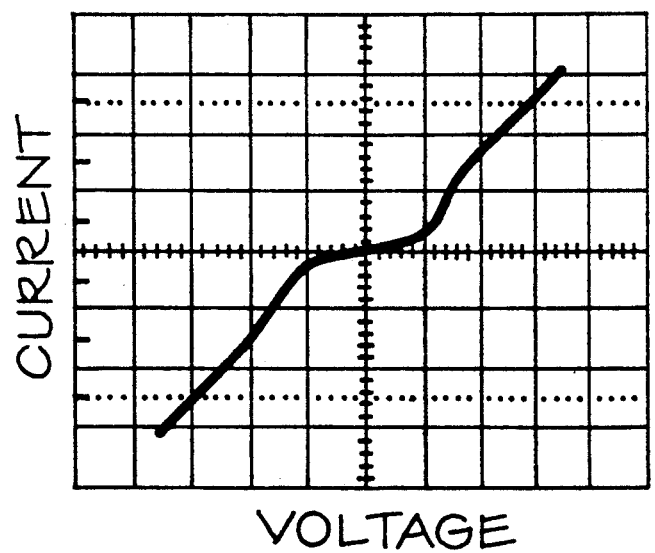
FIG. 2 is an actual current versus voltage trace of an SIS Josephson tunnel junction fabricated according to the present invention.

Turning now to the drawings, FIG. 2 is the current-voltage trace of actual results achieved by the present invention. The trace was obtained using a superconductor-insulating-superconductor (SIS) Josephson tunnel junction fabricated as a trilayer structure having a pair of electrodes made of BKBO material with a $KNbO_3$ barrier material placed between the electrodes. The temperature of the junction was held at 12.2K during the trace period. Vertical scale is 0.5 $\mu$A/div. and horizontal scale is 5 mV/div. The $V_g$ gap voltage is 7 mV, consistent with the superconducting transition temperature $T_c=23K$ of the device. The expected pair tunneling current at zero bias was not seen during the experiments since the measurements were taken in an electrically unshielded laboratory. Electrical noise from the surrounding environment was picked up by the test circuit and quenches the small supercurrent expected at zero bias voltage. However, the noise does not effect the quasi-particle tunneling behavior of the junction device which is displayed as near-ideal behavior in FIG. 2.

Figure 3:
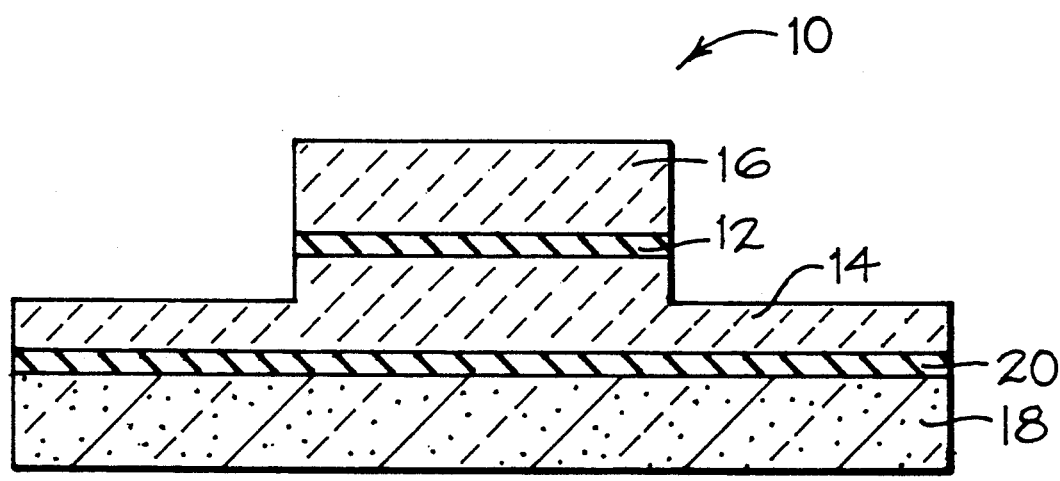
FIG. 3 is a cross-sectional view of an SIS Josephson tunnel junction according to the present invention.

FIG. 3 illustrates a cross-section of an SIS Josephson tunnel junction 10. Junction 10 may be a trilayer or sandwich-type structure comprising an insulating barrier material 12 placed between a first superconducting material 14 and a second superconducting material 16. The entire trilayer structure is epitaxially grown layer-by-layer onto a substrate 18 which lends support to the trilayer junction. A suitable substrate 18 includes a chemical composition which may be either $SrTiO_3$ (either oriented along the 100 or 110 plane) or MgO oriented along the 100 plane. Additional ground and insulator layers can be placed between substrate 18 and first superconducting material 14. The ground and insulator layers place active device 10 above a superconducting ground plane which often can enhance circuit performance of the integrated circuit or device. The ground and insulator layers should not influence the behavior of the individual tunnel junction except to enable the concentration of magnetic fields within the junction. Application of magnetic fields can be used to switch the device by lowering its critical current.

Other single crystal material can be used in substrate 18 such as, e.g., Si or $Al_2O_3$ provided a buffer layer 20 is deposited between substrate 18 and first superconductive material 14. Buffer material 20 can be made of the same material used by barrier 12, or other suitable materials such as CeO or $Y_2O_3$ may also be used as postulated by the inventor. The purpose of buffer layer 20 is to allow more variability in the selection of substrate 18. Various types of substrates can be used provided buffer layer 20 is chemically and structurally configured to prevent diffusion between substrate 18 and first superconducting electrode 14. Thus, buffer 20 is used to substantially prevent diffusion between the superconducting electrode and the substrate, however, buffer 20 is also structured as a template for promoting further crystalline growth necessary for proper electrode lattice formation.

FIG. 3 illustrates only one of many geometric designs for an SIS Josephson tunnel junction. It is important to note that within the scope of the present invention are Josephson junctions fabricated as a trilayer or sandwich-type structures or as a step-edge configuration. Provided that the resulting structure achieves high quality SIS Josephson effect (maintaining historesis and insulative ability) throughout operation, any form or structure can be utilized including step-edge junctions as well as the thin-film sandwich-type structure shown in FIG. 3.

First superconductive electrode 14 is physically separated by and in intimate contact with barrier 12. As specified herein, first electrode 14 as well as second electrode 16, are made of superconducting compounds wherein the parent compound is barium bismuth oxide ($BaBiO_3$). An alkali element such as lithium (Li), sodium (Na), potassium (K) or rubidium (Rb) is added to the parent compound in fairly precise concentrations to form the superconducting material. Preferably, alkali such as K or Rb are added to form $Ba_{1-x}K_xBiO_3$ and $Ba_{1-x}Rb_xBiO_3$, respectively. Each of the resulting superconductive materials, commonly called BKBO or BRBO materials, produce high quality histeretic SIS Josephson behavior with transition temperature $T_c$ approximately equal to 30K. The transition temperature is highest when concentration x is approximately equal to 0.4 (or when the concentration ratio of K/Ba and Rb/Ba is approximately equal to 0.4/0.6). BKBO and BRBO are structurally similar and have almost identical properties. BKBO has a cubic perovskite structure with lattice constant, a, equal to approximately 4.28 angstroms at concentration x of approximately 0.4. BRBO is also a cubic perovskite structure with a lattice constant, a, approximately equal to 4.30 angstroms at a concentration x of approximately 0.4. Since BKBO and BRBO superconductive materials have higher superconducting transition temperatures $T_c$ then, e.g., NbN, and hence larger switching voltages, they are desirable choices for superconducting electrodes in SIS devices. As shown above, the switching voltages of the present invention using BKBO and BRBO superconductors are typically near 7.0 mV as compared to approximately 3.0 mV to 5.0 mV of many conventional superconducting electrodes. It is important to note that other superconducting electrode materials may also be used in lieu of or in addition to BKBO or BRBO such as $Ba_{1-x-y}K_xRb_yBiO_3$ (BKRBO) or $Ba_{1-x}K_xBi_{1-y}Pb_yO_3$ (BKBPO) or $Ba_{1-x}Rb_xBi_{1-y}Pb_yO_3$ (BRBPO). Provided the superconducting electrode and materials chosen therefore have ionic structures matching the barrier material, there is some flexibility in the choice of the electrode composition.

If the superconducting electrodes 14 and 16 are BKBO, then barrier 12 preferably includes K in its compound structure. Thus, a preferred compound is $KNbO_3$. $KNbO_3$ is a perovskite, pseudocubic structure with a lattice constant, a, equal to approximately 4.03 angstroms. Conversely, if superconducting electrodes are BRBO, then barrier 12 preferably contains Rb or a chemical compound of $RbNbO_3$. Regardless of the type of superconducting electrode chosen, the barrier lattice constant should be at or near the lattice constant of the adjacent superconductor electrodes in order to avoid crystalline growth defects. Barrier 12 utilizes compounds containing alkali elements and preferably utilizes compounds selected from the group consisting of the niobates and tantalates of lithium (Li), sodium (Na), potassium (K) and rubidium (Rb). $KNbO_3$ and $KTaO_3$ (with lattice constant a equal to 3.99) are preferably chosen as the barrier material for either BKBO or BRBO with good lattice match at the interface regions. Grown as a trilayer structure, $KNbO_3$ or $KTaO_3$ combined with BKBO or BRBO allow all three layers to be grown consecutively in a single deposition chamber without any intermediate steps which could degrade the interface region.

Figure 4:
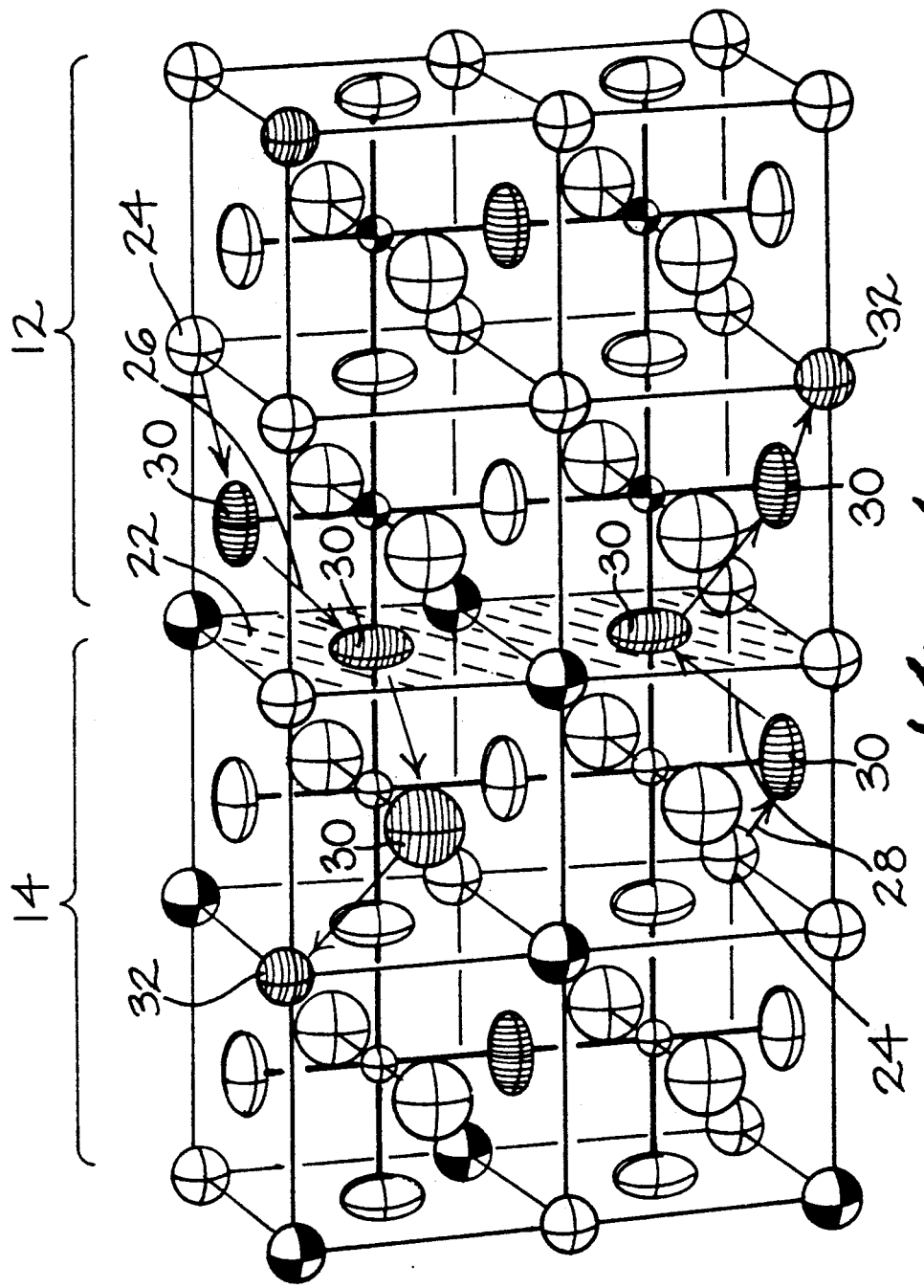
FIG. 4 is an enlarged perspective view of the atomic structure at an superconductor electrode-barrier interface region of an SIS Josephson tunnel junction according to the present invention.

Turning now to FIG. 4, an enlarged perspective view of the atomic structure at the interface 22 between one electrode 14 and barrier 12 is shown using, as an example, an alkali ion 24 (which could be Li, Na, K or Rb) moving across the interface. FIG. 4 illustrates movement of alkali ion 24 along first path 26 from barrier 12 to the first electrode 14. Conversely, alkali ion 24 moves along second path 28 from first electrode 14 to barrier 12. It is well known that the alkali ions 24 are highly mobile in solid structures and accordingly will freely move or migrate across the barrier-superconductor interface 22 regions. At the elevated temperatures and low oxygen partial pressures needed to grow BKBO or BRBO (250° C.–500° C.), both in thin-film and bulk form, many oxygen vacancies 30 are created in the solid through which the alkali ions 24 can diffuse. Thus, alkali ions 24 move along the path created by oxygen ion vacancies 30 until they reach their destination 32. It is possible, however, that the alkali ions 24 may also move not directly along the oxygen vacancy trail but instead occupy other vacancies along the way until they reach their final destination 32. Certainly another path of diffusion which may occur is through a series of direct interchanges between an alkali ion and a neighboring Ba ion. Whatever path is chosen, the ions remain highly mobile and have a propensity to cross the superconductor-barrier interface 22.

Figure 5:
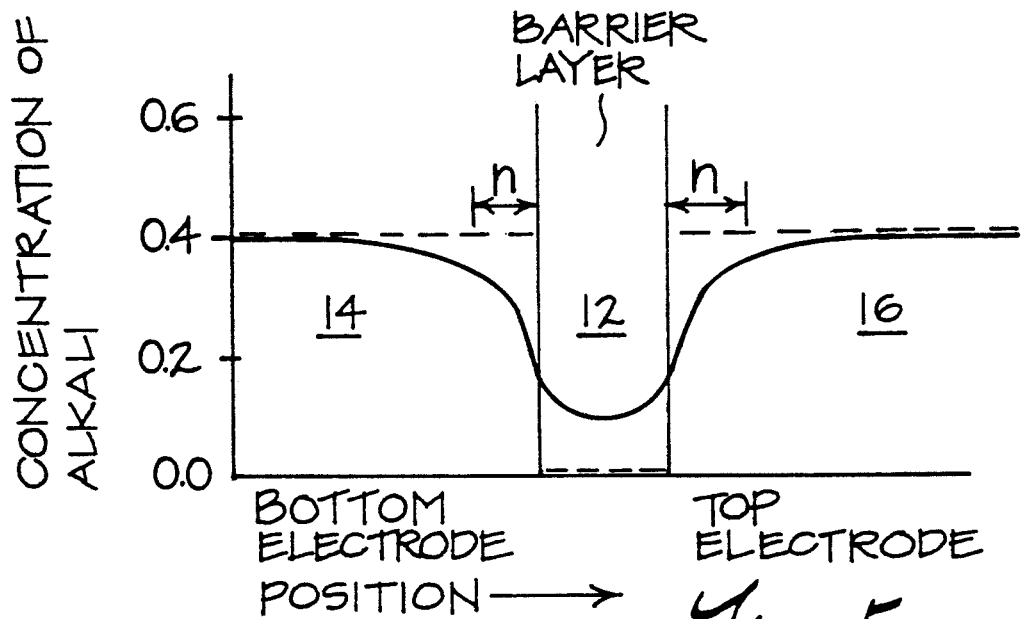
FIG. 5 is a graph of possible concentration of alkali ions along the superconductor electrodes-barrier interface regions according to a prior design.
Figure 6:
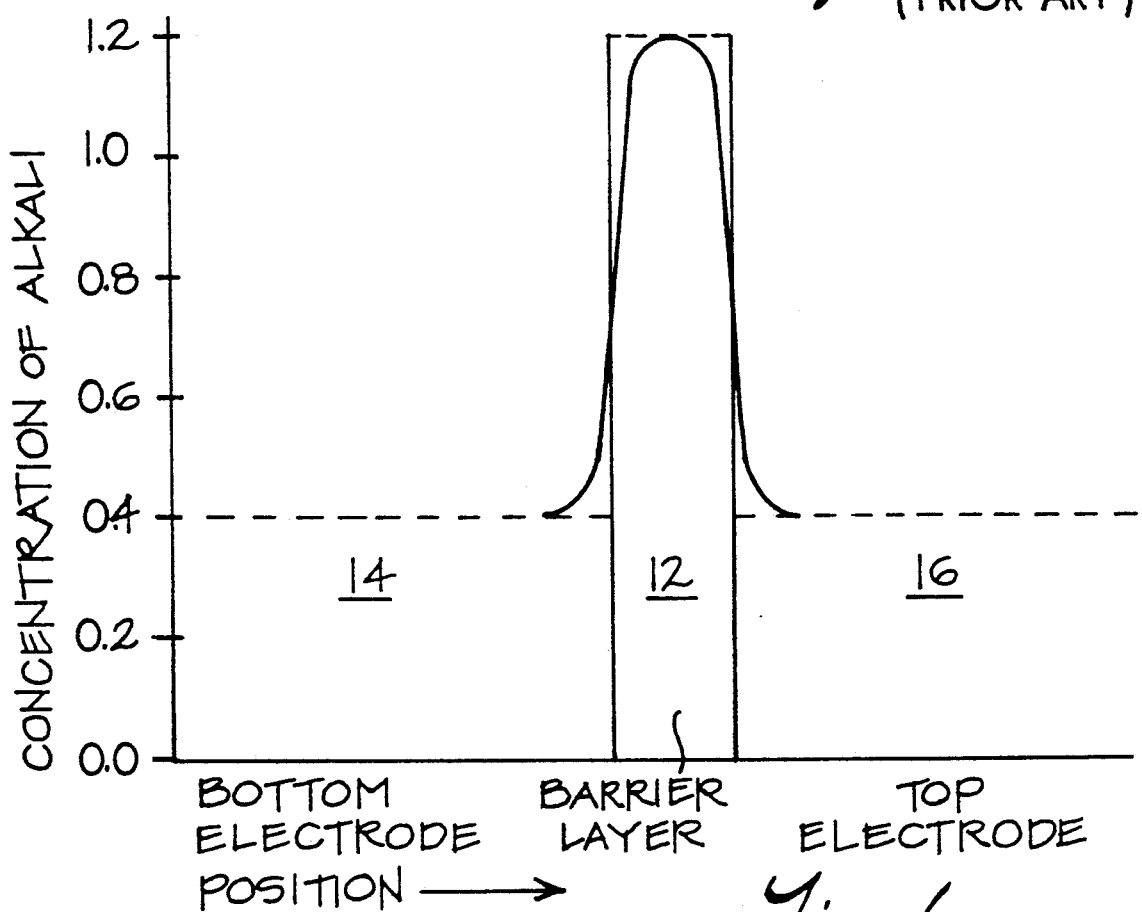
FIG. 6 is a graph of possible concentration of alkali ions along the superconductor electrodes-barrier interface regions according to the present invention.

Turning now to FIG. 5, a graph illustrates the relative movement of alkali ions across the interface 22. As opposed to the prior art diagram of FIG. 5, FIG. 6 illustrates that the presence of an alkali compound within barrier 12 will ensure that the first electrodes 14 and 16 will remain superconducting. The net migration of alkali ions is shown to be from the barrier 12 containing an alkali compound or alkali metal. Thus, increase in barrier alkali concentration prevents alkali concentration x in the superconducting electrodes from dropping substantially below its superconducting optimal level of 0.4. If the initial alkali concentrations (shown by dashed lines) are targeted as shown, then the greater initial concentration within the barrier will provide a slight increase in concentration within the electrodes near the barrier as shown in solid line. The final alkali concentration, however, will remain at or above the optimal concentration level of 0.4 throughout the electrode region. As appreciated from FIG. 6 and as will be discussed later, alkali concentrations in the superconducting regions which extend above the optimal level will not present non-superconducting regions unless the final concentration levels are excessive (greater than 0.5). However slight deviations below 0.4 could cause non-superconducting regions as discussed above and as shown in FIG. 5. A preferred structure is thereby that of the barrier acting as an alkali ion source and not as an alkali ion sink. To ensure that alkali concentrations within the superconducting region near the barrier is maintained as close to 0.4 as possible, the initial concentrations near the barrier can be adjusted prior to barrier deposition so that during subsequent processing, the alkali concentrations eventually achieve 0.4 optimal levels.

Figure 7:
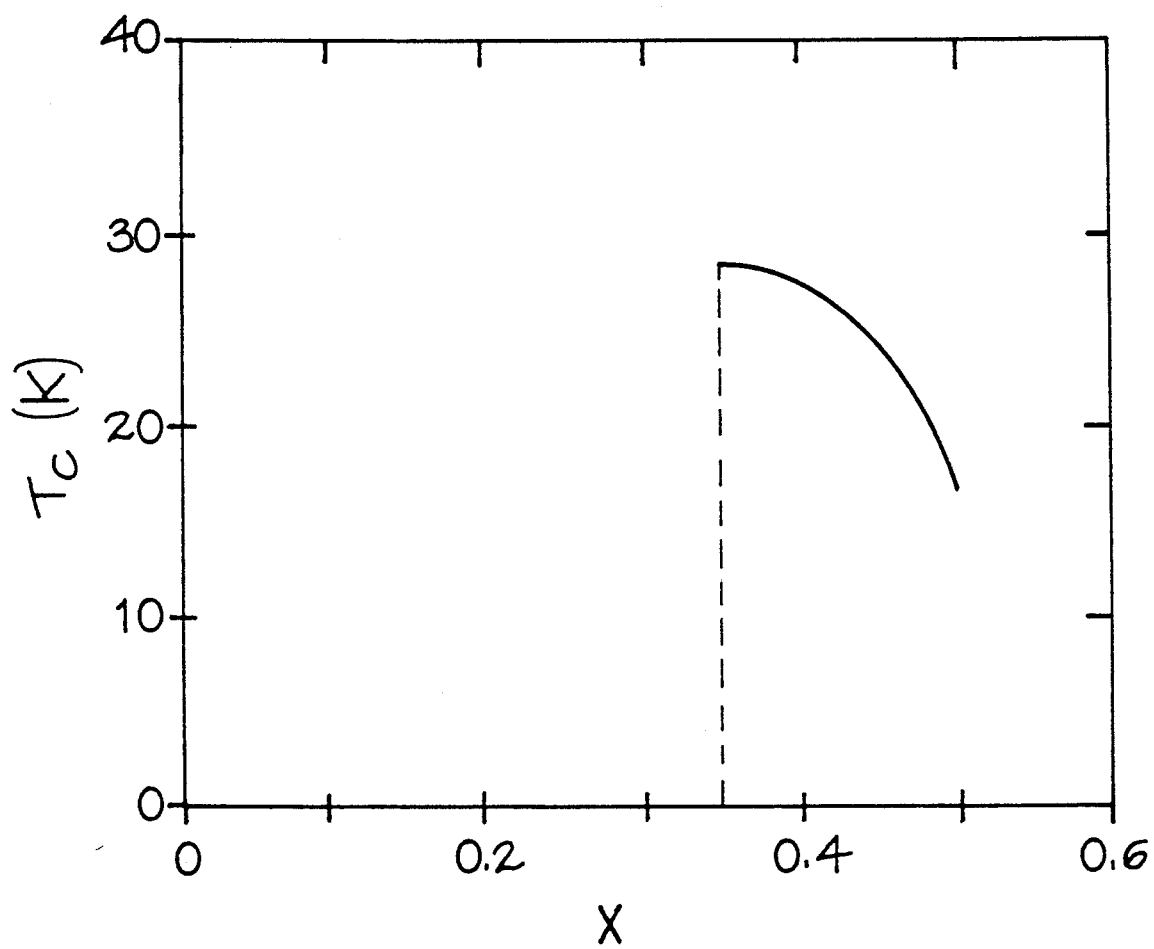
FIG. 7 is a graph of critical temperature $T_c$ as a function of K ion concentration.

FIG. 7 illustrates the importance of maintaining superconductor electrode alkali concentrations at or above 0.4 rather than below 0.4. As shown in the graph of FIG. 7, superconducting transition temperature $T_c$ is a function of the ion concentration (specifically potassium ion concentration) in a BKBO superconducting electrode. Similar results are predicted for BRBO structures as well. As described in S. Pei, et al., "Structural Phase Diagram of the $Ba_{1-x}K_xBiO_3$ System," *Physical Review B*, vol. 41 no. 7, March 1990, concentrations which fall below 0.37 in a BKBO structure cause a sharp drop of critical temperature $T_c$ (shown in dashed line) from near 30° K to below 4.2° K. However, concentrations approaching 0.5 will lower $T_c$ but will not cause it to drop all the way to 0° K. As such, FIG. 7 describes the importance of maintaining concentrations optimally at or above 0.4, but caution must be exercised if electrode alkali concentration drops below 0.4. Since barrier 12 of the present invention serves as an alkali concentration source rather than a sink, the present invention ensures the alkali concentration within the electrode does not drop below a target value such as, e.g., 0.4.

Figure 8A:
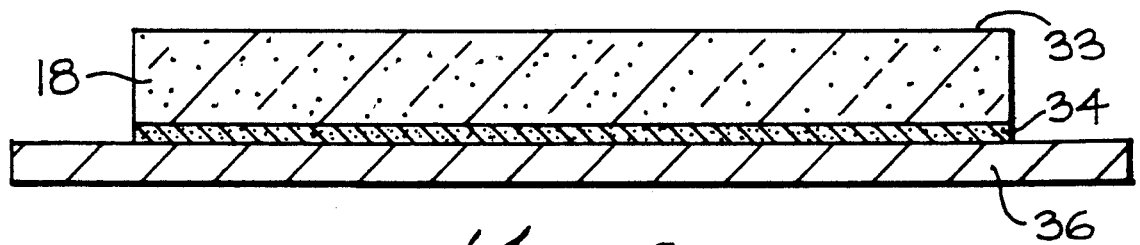
FIGS. 8a–8g are cross-sectional views of the principal portions at the respective processing steps according to the present invention.

Turning now to FIGS. 8a–8g, cross-sectional views of principal processing steps of an integrated circuit incorporating junction 10 is shown. Illustrated in FIG. 8a is a polished and cleaned substrate 18 having its polished surface extending along the entire upper surface 33 of substrate 18. A silver paste 34 is placed on the upper surface of a substrate heater 36 and between heater 36 and substrate 18. Paste 34 is used to adhere substrate 18 to heater 36 and provides good thermal conduction therebetween. Heater 36 is heated using conventional means such as, e.g., resistive coil induction. The temperature is monitored by an imbedded type K thermocouple.

Figure 8B:
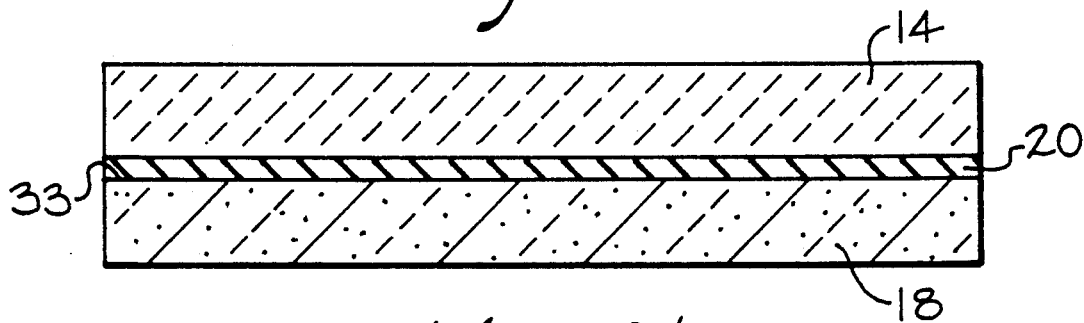

FIG. 8b illustrates buffer material 20 epitaxially grown on the upper surface 33 of substrate 18 if the chosen substrate requires a buffer material 20 be used. RF sputtering may be used to grow a layer of buffer material 20 on the upper surface 33. Next, the first superconducting material 14 is epitaxially grown on the buffer layer also using rf sputtering techniques. An off-axis sputtering geometry as described in A. Lee et al., "LaAlO$_3$-YBCO Multilayers," *IEEE Trans. on Mag.*, vol. 27, no. 2, March 1991 is preferred. The sputtering target needed to deposit the first material 14 may be superconductive and may comprise $Ba_{0.6}K_{0.4}BiO_3$ material. Other target compositions may also be used successfully with appropriate changes in deposition parameters. Typical sputter parameters using BKBO material are: Ar:O$_2$ flow rates = 50 sccm:50 sccm; pressure=460 mtorr: power=50 watts; target size=two inches O.D.; substrate temperature=430° C. ±10° C.; deposition time=4 hrs.; and film thickness=2400 angstroms. The substrate temperature may initially be higher than 430° C. to help initiate growth, however, after approximately ten minutes the temperature is reduced to 430° C. It is important to note that film thickness of 2400 angstroms will vary depending upon changes in the deposition parameters given above.

Figure 8C:
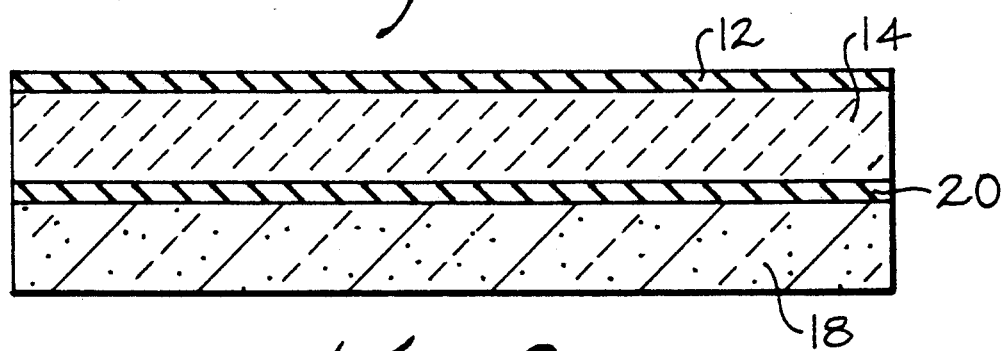

FIG. 8c illustrates barrier 12 epitaxially grown onto the upper surface of first superconducting material 14. Similar to buffer 20, barrier 12 is deposited using rf sputtering. The sputter target needed to deposit buffer 20 may be $KNbO_3$ or $K_2NbO_3$ or $KTaO_3$. Because of the high vapor pressure of K, the preferred target is K$_2$NbO$_5$. It is postulated that other niobates or tantalates of the alkali metals (Li, Na, K and Rb) may also prove suitable target material. Typical deposition parameters for barrier 12 are: Ar:O$_2$ flow rate=85 sccm:65 sccm; pressure=30 mtorr; power=50 watts; target size=two inch O.D.; substrate temperature=420° C. ±10° C.; film thickness=approximately 20 angstroms; and deposition time=approximately 10 min. The film thickness and deposition time will vary depending upon changes in the above parameters. Therefore, the deposition rates will vary depending upon varying deposition conditions.

Figure 8D:
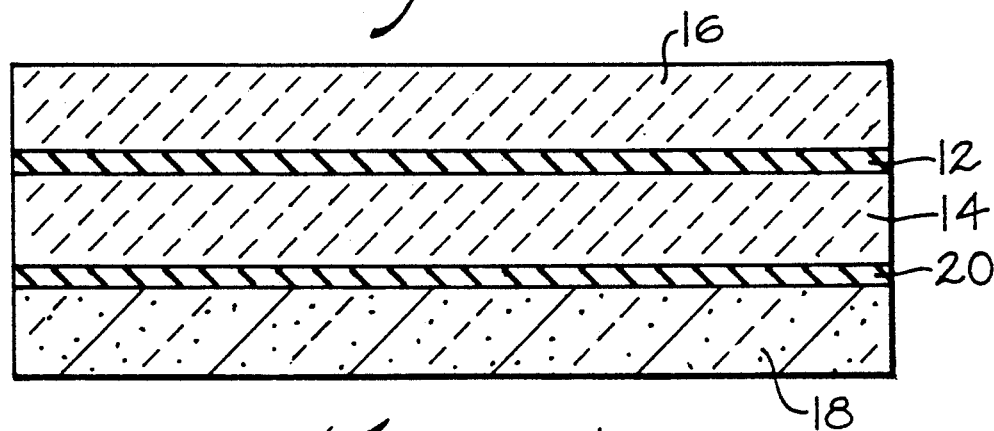

FIG. 8d illustrates second superconducting material 16 placed upon the upper surface of barrier 12 thereby forming a thin-film trilayer sandwich-type structure. The second superconducting electrode 16 is deposited using the same deposition parameters as the first electrode 14, except that the deposition time is somewhat shorter. A preferred deposition time is approximately 90 minutes at a substrate temperature of 430° C.±10° C. After deposition has been completed, substrate heater/holder 36 is then cooled to 400° C.±10° C. and the chamber is backfilled with O$_2$ to a pressure of approximately 500 Torr. After another 30 minutes±20 minutes the sample is allowed to cool to room temperature. The above parameters may of course vary depending upon the particular desired outcome or the constraints of the system. Other means of depositing layers of film such as, e.g., laser ablation are possible. Therefore, there parameters are used simply as an example and are not meant to limit the invention and/or the processing steps necessary to produce a trilayer structure according to the present invention.

Figure 8E:
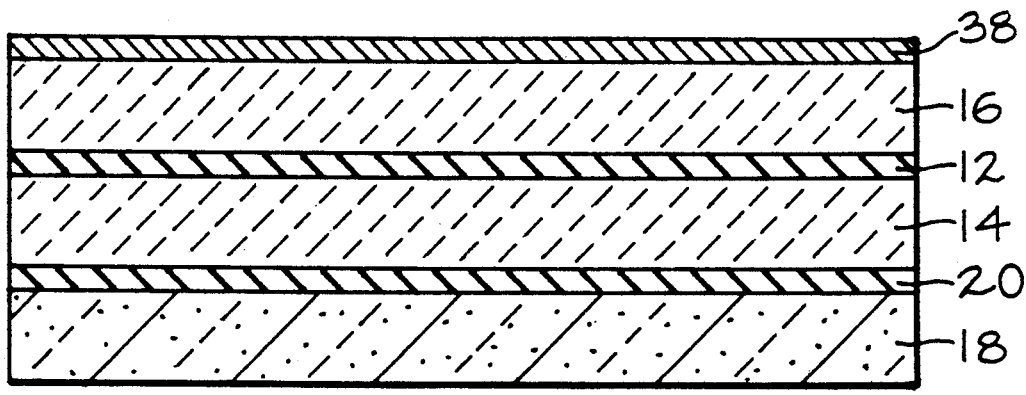
Figure 8F:
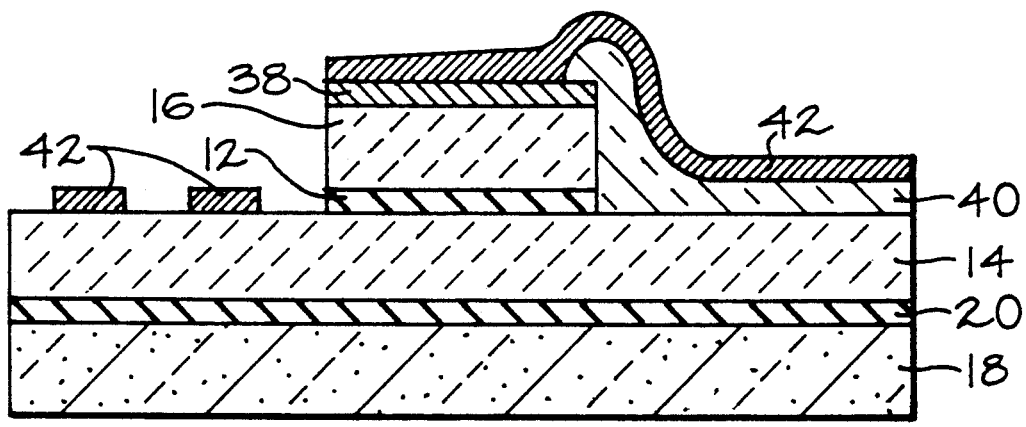

FIG. 8e illustrates a silver layer 38 (typically 600 angstroms thick) placed on the top of second electrode 16 while the sample is still in the deposition chamber and before it is exposed to atmosphere. Silver layer 38 is generally used for applications which do not require superconducting interconnects to both top and bottom electrodes 16 and 14, respectively. Once deposited, the silver layer 38 is annealed in O$_2$ at a pressure of approximately 500 torr at a temperature of approximately of 250° C. in order to improve contact between silver 38 and top superconducting electrode 16. After the sample is cooled, it is removed from the chamber and standard photolithographic patterning techniques and standard etching techniques (such as ion milling) are used to define junctions throughout the ensuing integrated circuit. An isolation layer 40 made of insulating material commonly known in the art is then deposited and patterned as shown in FIG. 8f. Metal leads 42 are then defined to allow contact to top and bottom electrodes 16 and 14, respectively. FIG. 8f illustrates a single junction device 10 placed on the surface of a substrate 18, however, it is understood that many superconducting or non-superconducting junctions can be fabricated across the surface on a single wafer as is inherently performed in integrated circuit fabrication.

Figure 8G:
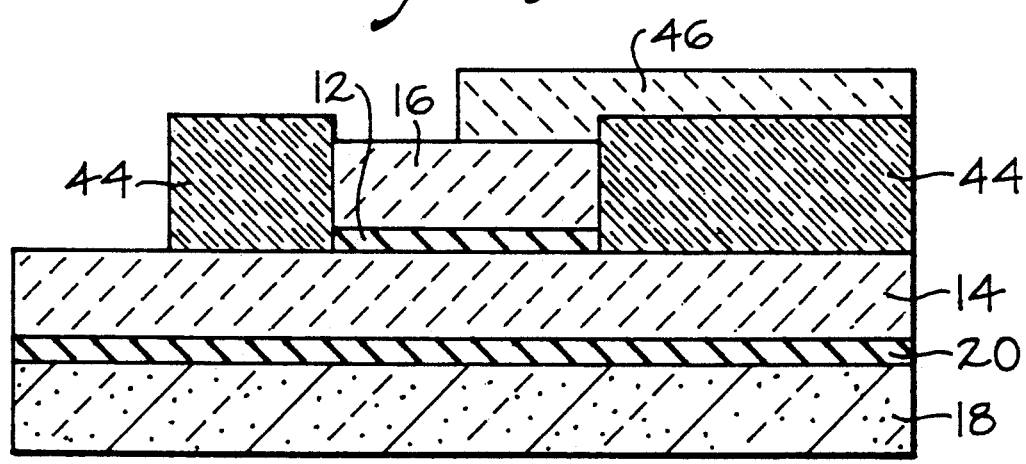

For device applications which require superconducting leads to both and top and bottom electrodes 14 and 16, respectively, silver need not be deposited on the top electrode as shown in FIGS. 8e and 8f instead, a crystalline isolation layer 44, shown in FIG. 8g, allows growth of superconducting oxides 46 including BKBO and BRBO on the upper surface of isolation layer 44. The BKBO and BRBO oxides 46 are but two examples of oxide superconducting materials used in lieu of the non-superconducting leads shown in FIG. 8f. In order that BKBO and BRBO oxides be crystalline and contain superconducting properties, isolation layer 44 must also be crystalline for the epitaxially growing superconducting material at the contact leads 46. It is postulated that fabrication of crystalline isolation layer 44 can be readily accomplished by using technology previously established for YBCO circuits. It is anticipated that there will be many similarities used between the methods used to produce YBCO superconducting leads and the desired method needed to produce BKBO or BRBO superconducting leads. Given the current state of technology, it is therefore within the scope of the present invention to produce superconducting leads using BKBO or BRBO oxides formed on a crystalline layer in order to meet application demands.

It will be appreciated by those skilled in the art having the benefit of this disclosure that this invention is believed to be capable of applications with numerous types of Josephson devices 10 or integrated circuits embodying the same. Provided device 10 is capable of producing tunneling of supercurrents, the geometry of device 10 is not of major consequence. Device 10 is shown hereof as a trilayer structure, however, other geometries or structures may also prove suitable. Moreover, depending on the application, superconducting or non-superconducting leads 42 and 46, respectively, may be used as well as a buffer layer 20.

It is also to be understood that the form of the invention shown and described is to be taken as a presently preferred embodiment. Various modifications and changes may be made without departing from the spirit and scope of the invention as set forth in the claims. It is intended that the following claims be interpreted to embrace all such modifications and changes.

What is claimed is:

1. A superconductor Josephson junction comprising:
   a first and a second superconducting material of substantially the same chemical composition, wherein each material comprises a first alkali ion concentration and a chemical selected from the group consisting of Ba$_{1-x}$K$_x$BiO$_3$ and Ba$_{1-x}$Rb$_x$BiO$_3$ (wherein $0.37 \leq x \leq 0.5$); and
   an insulating barrier formed between said first and second superconducting materials, wherein said barrier comprises an alkali compound having an alkali ion concentration greater than said first alkali ion concentration.

2. The Josephson junction as recited in claim 1, wherein said alkali compound comprises an element from the group consisting of Li, Na, K and Rb.

3. The Josephson junction as recited in claim 1, wherein said alkali compound comprises K.

4. The Josephson junction as recited in claim 1, wherein said alkali compound comprises Rb.

5. The Josephson junction as recited in claim 1, wherein said first superconducting material is crystalline and adapted for epitaxially receiving a thin film of crystalline said insulating barrier.

6. The Josephson junction as recited in claim 1, wherein said insulating barrier is crystalline and adapted for epitaxially receiving a thin film of crystalline said second superconducting material.

7. The Josephson junction as recited in claim 1, wherein said insulating barrier comprises a plurality of alkali ions which diffuse to said first and second superconducting material resulting in a concentration ratio of K/Ba and Rb/Ba being approximately equal to 0.4/0.6.

8. The Josephson junction as recited in claim 1, wherein said insulating barrier comprises a plurality of alkali ions which diffuse to said first and second superconducting material resulting in a concentration ratio of K/Ba and Rb/Ba being greater than 0.4/0.6.

9. The Josephson junction as recited in claim 1, wherein said insulating barrier comprises a barrier interface region adjacent to said first and second superconducting materials, said interface region comprises a plurality of K ions which diffuse to said first and second superconducting material comprising $Ba_{1-x}K_xBiO_3$, wherein x is maintained approximately equal to 0.4.

10. The Josephson junction as recited in claim 1, wherein said insulating barrier comprises a barrier interface region adjacent to said first and second superconducting materials, said interface region comprises a plurality of Rb ions which diffuse to said first and second superconducting material comprising $Ba_{1-x}Rb_xBiO_3$, wherein x is maintained approximately equal to 0.4.

11. A superconductor Josephson integrated circuit comprising:
a single crystalline substrate having a planar surface;
a thin film of first superconducting material epitaxially grown upon the planar surface of said substrate, wherein said first superconducting material comprises a chemical selected from the group consisting of $Ba_{1-x}K_xBiO_3$ and $Ba_{1-x}Rb_xBiO_3$ (wherein $0.37 \leq x \leq 0.5$);
a thin film of insulating barrier material epitaxially grown upon said first superconducting material, wherein said barrier comprises a chemical selected from the group consisting of the niobates of Li, Na, K and Rb;
a thin film of second superconducting material epitaxially grown upon said insulating barrier, said second superconducting material is of substantially the same chemical composition as said first superconducting material and comprises a chemical compound selected from the group consisting of $Ba_{1-x}K_xBiO_3$ and $Ba_{1-x}Rb_xBiO_3$ (wherein $0.37 \leq x \leq 0.5$);
said first and second superconducting material each having a first alkali ion concentration, and said barrier material having a concentration of alkali ions greater than said first alkali ion concentration; and
an electrical lead coupled to each of said first and second superconducting materials.

12. The Josephson integrated circuit as recited in claim 11, wherein said barrier further comprises a chemical selected from the group consisting of the tantalates of Li, Na, K and Rb;

13. The Josephson integrated circuit as recited in claim 11, wherein said niobates of Li, Na, K and Rb comprises $LiNbO_3$, $NaNbO_3$, $KNbO_3$ and $RbNbO_3$, respectively.

14. The Josephson integrated circuit as recited in claim 12, wherein said tantalates of Li, Na, K and Rb comprises $LiTaO_3$, $NaTaO_3$, $KTaO_3$ and $RbTaO_3$, respectively.

15. The Josephson integrated circuit as recited in claim 11, wherein said substrate comprises $SrTiO_3$.

16. The Josephson integrated circuit as recited in claim 11, wherein a concentration ratio of K/Ba and Rb/Ba within said first and second superconducting materials remains approximately equal to 0.4/0.6 during cross diffusions of a plurality of mobile alkali ions to and from said barrier.

17. The Josephson integrated circuit as recited in claim 11, wherein a concentration ratio of K/Ba and Rb/Ba within said first and second superconducting materials remains greater than 0.4/0.6 during cross diffusions of a plurality of mobile alkali ions to and from said barrier.

18. A superconductor Josephson integrated circuit comprising:
a single crystalline substrate having a planar surface;
a thin film of first superconducting material epitaxially grown upon the planar surface of said substrate, wherein said first superconducting material comprises a chemical selected from the group consisting of $Ba_{1-x}K_xBiO_3$ and $Ba_{1-x}Rb_xBiO_3$ (wherein $0.37 \leq x \leq 0.5$);
a thin film of insulating barrier material epitaxially grown upon said first superconducting material, wherein said barrier comprises a chemical selected from the group consisting of the tantalates of Li, Na, K and Rb;
a thin film of second superconducting material epitaxially grown upon said insulating barrier, said second superconducting material is of substantially the same chemical composition as said first superconducting material and comprises a chemical compound selected from the group consisting of $Ba_{1-x}K_xBiO_3$ and $Ba_{1-x}Rb_xBiO_3$ (wherein $0.37 \leq x \leq 0.5$);
said first and second superconducting material each having a first alkali ion concentration, and said barrier material having a concentration of alkali ions greater than said first alkali ion concentration; and
an electrical lead coupled to each of said first and second superconducting materials.

19. The Josephson integrated circuit as recited in claim 18, wherein said tantalates of Li, Na, K and Rb comprises $LiTaO_3$, $NaTaO_3$, $KTaO_3$ and $RbTaO_3$, respectively.

20. The Josephson integrated circuit as recited in claim 18, wherein said barrier further comprises a chemical selected from the group consisting of the niobates of Li, Na, K and Rb.

21. The Josephson integrated circuit as recited in claim 20, wherein said niobates of Li, Na, K and Rb comprises $LiNbO_3$, $NaNbO_3$, $KNbO_3$ and $RbNbO_3$, respectively.

22. The Josephson integrated circuit as recited in claim 18, wherein a concentration ration of K/Ba and Rb/Ba within said first and second superconducting materials remains approximately equal to 0.4/0.6 during cross diffusions of a plurality of mobile alkali ions to and from said barrier.

23. The Josephson integrated circuit as recited in claim 18, wherein a concentration ratio of K/Ba and Rb/Ba within said first and second superconducting materials remains greater than 0.4/0.6 during cross diffusions of a plurality of mobile alkali ions to and from said barrier.

24. A superconductor Josephson integrated circuit comprising:
a single crystalline substrate comprising $SrTiO_3$ oriented along the 110 plane;
a thin film of first superconducting material epitaxially grown upon said substrate, wherein said first superconducting material comprises a chemical compound of $Ba_{1-x}K_xBiO_3$ (wherein $0.37 \leq x \leq 0.5$);

a thin film of insulating barrier epitaxially grown upon said first superconducting material, wherein said barrier comprises a chemical compound $KNbO_3$;

a thin film of second superconducting material epitaxially grown upon said insulating barrier, wherein said second superconducting material is of substantially the same chemical composition as said first superconducting material and comprises a chemical compound of $Ba_{1-x}K_xBiO_3$ (wherein $0.37 \leq x \leq 0.5$);

said first and second superconducting material each having a first alkali ion concentration, and said barrier material having a concentration of alkali ions greater than said first alkali ion concentration; and an electrical lead coupled to each of said first and second superconducting materials.

25. A superconductor Josephson integrated circuit comprising:

a single crystalline substrate comprising $SrTiO_3$ oriented along the 110 plane;

a thin film of first superconducting material epitaxially grown upon said substrate, wherein said first superconducting material comprises a chemical compound of $Ba_{1-x}Rb_xBiO_3$ (wherein $0.37 \leq x \leq 0.5$);

a thin film of insulating barrier epitaxially grown upon said first superconducting material, wherein said barrier comprises a chemical compound $RbNbO_3$;

a thin film of second superconducting material epitaxially grown upon said insulating barrier, wherein said second superconducting material is of substantially the same chemical composition as said first superconducting material and comprises a chemical compound of $Ba_{1-x}Rb_xBiO_3$ (wherein $0.37 \leq x \leq 0.5$);

said first and second superconducting material each having a first alkali ion concentration, and said barrier material having a concentration of alkali ions greater than said first alkali ion concentration; and an electrical lead coupled to each of said first and second superconducting materials.

* * * * *

UNITED STATES PATENT AND TRADEMARK OFFICE
CERTIFICATE OF CORRECTION

PATENT NO. : 5,250,817
DATED : October 5, 1993
INVENTOR(S) : Richard L. Fink

It is certified that error appears in the above-indentified patent and that said Letters Patent is hereby corrected as shown below:

Col. 1, line 6, after "invention and" please insert --the right in --.

Col. 11, line 30, please delete "there" and substitute therefor --these--.

Claim 22, col. 14, line 51, please delete "ration" and substitute therefor --ratio--.

Claim 24, col. 15, line 12, please delete "$Ba_{1-x}K_xBio_3$" and substitute therefor --$Ba_{1-x}K_xBiO_3$--.

Signed and Sealed this

Twenty-sixth Day of April, 1994

Attest:

BRUCE LEHMAN

Attesting Officer

Commissioner of Patents and Trademarks